US012625178B2

(12) United States Patent
Ichikawa et al.

(10) Patent No.: US 12,625,178 B2
(45) Date of Patent: May 12, 2026

(54) AUTOMATIC TEST EQUIPMENT

(71) Applicant: ADVANTEST CORPORATION,
Tokyo (JP)

(72) Inventors: Hiroki Ichikawa, Tokyo (JP); Tasuku Fujibe, Tokyo (JP)

(73) Assignee: ADVANTEST CORPORATION,
Tokyo (JP)

( * ) Notice: Subject to any disclaimer, the term of this patent is extended or adjusted under 35 U.S.C. 154(b) by 75 days.

(21) Appl. No.: 18/354,789

(22) Filed: Jul. 19, 2023

(65) Prior Publication Data

US 2024/0027523 A1    Jan. 25, 2024

(30) Foreign Application Priority Data

Jul. 22, 2022    (JP) ................................. 2022-117409

(51) Int. Cl.
| | | |
|---|---|---|
| *G01R 31/28* | (2006.01) | |
| *G01R 1/04* | (2006.01) | |
| *G01R 1/067* | (2006.01) | |
| *G01R 1/073* | (2006.01) | |
| *G01R 3/00* | (2006.01) | |

(Continued)

(52) U.S. Cl.
CPC ..... G01R 31/2887 (2013.01); G01R 1/07328 (2013.01); G01R 1/07357 (2013.01); G01R 31/2889 (2013.01); G01R 31/2893 (2013.01)

(58) Field of Classification Search
CPC ........ G01R 31/00; G01R 31/02; G01R 31/10; G01R 31/26; G01R 31/28; G01R 31/319; G01R 1/04; G01R 1/067; G01R 1/073; G01R 1/20; G01R 3/00
See application file for complete search history.

(56) References Cited

U.S. PATENT DOCUMENTS

| | | | |
|---|---|---|---|
| 6,078,187 A | 6/2000 | Hanners et al. | |
| 6,426,637 B1 | 7/2002 | Dang et al. | |

(Continued)

FOREIGN PATENT DOCUMENTS

| | | |
|---|---|---|
| CN | 106796266 A | 5/2017 |
| JP | 2008076308 A | 4/2008 |

(Continued)

OTHER PUBLICATIONS

KIPO Request for the Submission of an Opinion for corresponding Korean Application No. 10-2023-0087851; Issued Nov. 6, 2024.

(Continued)

*Primary Examiner* — Neel D Shah
(74) *Attorney, Agent, or Firm* — CANTOR COLBURN LLP

(57) ABSTRACT

An interface device is provided between a test head and a device under test (DUT). A socket board includes sockets each configured to mount a DUT, and a socket PCB having a first face that mounts the sockets and a second face provided with multiple back face electrodes. An interposer has a first face provided with multiple deformable electrodes and a second face provided with multiple non-deformable electrodes and is configured such that the multiple deformable electrodes are in contact with the multiple back face electrodes of the socket PCB. An FPC cable has multiple electrode pads to be coupled with the multiple non-deformable electrodes on the second face of the first interposer.

10 Claims, 12 Drawing Sheets

(51) Int. Cl.
  G01R 31/02    (2006.01)
  G01R 31/26    (2020.01)

(56) References Cited

U.S. PATENT DOCUMENTS

| | | | | |
|---|---|---|---|---|
| 6,489,790 | B1 * | 12/2002 | An | G01R 1/073 |
| | | | | 324/754.14 |
| 7,180,318 | B1 | 2/2007 | Mahoney et al. | |
| 9,568,498 | B2 * | 2/2017 | Alves Moreira | H05K 1/0268 |
| 11,966,677 | B1 | 4/2024 | Goveas et al. | |
| 2006/0001435 | A1 | 1/2006 | Teneketges | |
| 2006/0139017 | A1 | 6/2006 | Peiffer | |
| 2008/0265926 | A1 * | 10/2008 | Kawasumi | G01R 31/2886 |
| | | | | 324/756.01 |
| 2009/0134895 | A1 * | 5/2009 | Miller | G01R 31/2889 |
| | | | | 324/762.05 |
| 2014/0253099 | A1 | 9/2014 | Han et al. | |
| 2014/0347084 | A1 | 11/2014 | Hu et al. | |
| 2017/0212164 | A1 | 7/2017 | Caradonna et al. | |
| 2019/0377007 | A1 | 12/2019 | Mirkhani et al. | |
| 2024/0159825 | A1 | 5/2024 | Nukanobu et al. | |

FOREIGN PATENT DOCUMENTS

| | | |
|---|---|---|
| KR | 20050029119 A | 3/2005 |
| KR | 100609518 B1 | 7/2006 |
| KR | 20080027132 A | 3/2008 |
| KR | 20080095741 A | 10/2008 |
| KR | 20110134469 A | 12/2011 |
| KR | 20190125724 A | 11/2019 |
| TW | 200839257 A | 10/2008 |
| TW | 201007186 A | 2/2010 |
| TW | 201224462 A | 6/2012 |
| TW | I470242 B | 1/2015 |
| TW | 201518733 A | 5/2015 |
| TW | 202124967 A | 7/2021 |
| WO | 2009034641 A1 | 3/2009 |

OTHER PUBLICATIONS

KIPO Request for the Submission of an Opinion for corresponding Korean Application No. 10-2023-0087856, Issued Nov. 6, 2024.
KIPO Request for the Submission of an Opinion for corresponding Korean Application No. 10-2023-0087862; Issued Nov. 6, 2024.
TIPO Patent Refusal Decision for corresponding Taiwanese Application No. 112122099; Issued Sep. 18, 2024.
TIPO Patent Refusal Decision, for corresponding Taiwanese Application No. 112122251; Issued Sep. 18, 2024.
USPTO Non-Final Office Action for corresponding U.S. Appl. No. 18/354,198 dated Mar. 26, 2025.
USPTO Non-Final Office Action for corresponding U.S. Appl. No. 18/354,771 dated Apr. 3, 2025.
TIPO Office Action from corresponding TW Application No. 112122099; dated Jan. 11, 2024; 11 pages.
TIPO Office Action from corresponding TW Application No. 112122251; dated Jan. 11, 2024; 12 pages.
TIPO Office Action from corresponding TW Application No. 112122293; dated Jan. 11, 2024; 12 pages.
TIPO Notice of Examination Opinion for corresponding TW Application No. 112122508; Dated Mar. 8, 2024; 11 pages.
US Final Office Action for corresponding U.S. Appl. No. 18/354,771; issued Aug. 4, 2025.
KR Office Action for corresponding KR Application No. 1020230087851; Issued May 12, 2025.
USPTO Non-Final Office Action for corresponding U.S. Appl. No. 18/354,255; dated Apr. 28, 2025.
U.S. Non-Final Office Action for corresponding U.S. Appl. No. 18/354,771 dated Nov. 28, 2025.
USPTO Final Office Action for corresponding U.S. Appl. No. 18/354,198 dated Jul. 14, 2025.

* cited by examiner

CONVENTIONAL TECHNIQUE

AUTOMATIC TEST EQUIPMENT

CROSS REFERENCE TO RELATED APPLICATIONS

The present invention claims priority under 35 U.S.C. § 119 to Japanese Application, 2022-117409, filed on Jul. 22, 2022, the entire contents of which being incorporated herein by reference.

BACKGROUND

1. Technical Field

The present disclosure relates to an interface device of automatic test equipment.

2. Description of the Related Art

Automatic test equipment (ATE) is employed to test various kinds of semiconductor devices such as memory, central processing units (CPUs), or the like. An ATE supplies a test signal to a semiconductor device to be tested (which will be referred to as a "device under test (DUT)" hereafter) and measures the response of the DUT with respect to the test signal, so as to judge the quality of the DUT, or so as to identify a defective position.

FIG. 1 is a block diagram showing an ATE 10 according to a conventional technique. The ATE 10 includes a tester (which will also be referred to as a "tester main body") 20, a test head 30, an interface device 40, and a handler 50.

The tester 20 integrally controls the ATE 10. Specifically, the tester 20 executes a test program so as to control the test head 30 and the handler 50, and so as to collect measurement results.

The test head 30 is provided with a hardware component that generates a test signal to be supplied to a DUT 1, and that detects a signal (which will also be referred to as a "device signal") from the DUT. Specifically, the test head 30 is provided with a pin electronics (PE) 32, a power supply circuit (not shown), etc. The PE 32 is configured as an application specific IC (ASIC) including a driver, comparator, etc. Conventionally, the PE 32 is mounted on a printed circuit board which will also be referred to as a "PE board 34" and is housed within the test head 30.

The interface device 40 will also be referred to as a High Fidelity Tester Access Fixture (HiFIX). The interface device 40 relays the electrical connection between the test head 30 and the DUT 1. The interface device 40 includes a socket board 42. The socket board 42 includes multiple sockets 44. This allows multiple DUTs 1 to be measured at the same time. In a case in which the ATE is used to provide wafer-level testing, a probe card is employed instead of the socket board 42.

Multiple DUTs 1 are loaded into the multiple sockets 44 by means of the handler 50. Each DUT 1 is pressed in contact with the socket 44. After the test is completed, each DUT 1 is unloaded by means of the handler 50. As necessary, the handler 50 classifies the DUTs 1 into non-defective DUTs and defective DUTs.

The interface device 40 includes a socket board 42 and multiple cables 46 that couples the socket board 42 to the test head 30. A test signal generated by the PE 32 is transmitted to each DUT 1 via the corresponding cable 46. A device signal generated by each DUT 1 is transmitted to the PE 32 via the corresponding cable 46.

In recent years, dynamic random access memory (DRAM) speeds have been improving. In Graphics Double Data Rate (GDDR) memory according to the GDDR6X standard, which is mounted on graphic boards, a transmission speed of 21 Gbps has been realized using the Non Return to Zero (NRZ) method.

The GDDR7 standard, which is the next generation, employs Pulse Amplitude Modulation 4 (PAM4), which provides an improved transmission speed up to 40 Gbps. The speed provided by the NRZ method is also being improved year by year, and in the next generation, the speed will be improved to on the order of 28 Gbps.

In a case in which the transmission speed is higher than 20 Gbps, it is difficult for a memory tester employing a conventional architecture to provide accurate measurement. At present, there is no commercially available ATE that is capable of measuring high-speed memory having an operating speed of 28 Gbps or 40 Gbps.

SUMMARY

The present disclosure has been made in view of such a situation. It is an exemplary purpose of the present disclosure to provide an interface device and automatic test equipment that are capable of testing a high-speed device with high accuracy.

An interface device according to an embodiment of the present disclosure is provided between a test head and a device under test (DUT). The interface device includes: a socket structured to mount the DUT; and a socket printed circuit board having a first face that mounts the socket and a second face provided with multiple back face electrodes; a first interposer having a first face provided with multiple deformable electrodes and a second face provided with multiple non-deformable electrodes, and structured such that the multiple deformable electrodes are in contact with the multiple back face electrodes of the socket printed circuit board; and wiring having multiple electrode pads to be coupled to the multiple non-deformable electrodes on the second face of the first interposer.

It should be noted that any combination of the components described above, any component described above, or any manifestation described above may be mutually substituted between a method, apparatus, system, and so forth, which are also effective as an embodiment of the present invention or the present disclosure. The description of the items (means for solving the problems) is by no means intended to describe all the indispensable features of the present invention. That is to say, any sub-combination of the features as described above is also encompassed in the technical scope of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1:
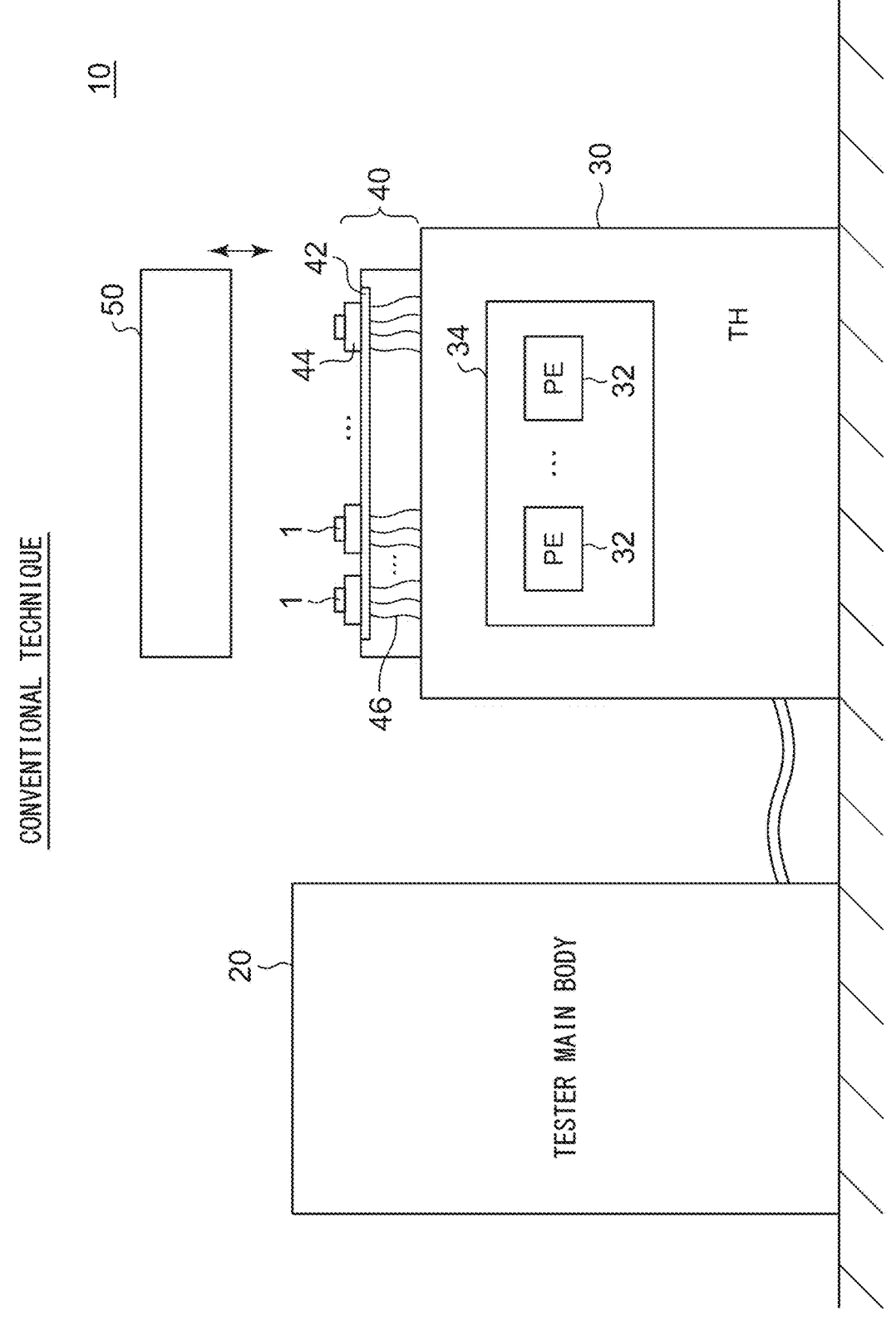
FIG. 1 is a block diagram showing a conventional ATE.

Description will be made regarding the outline of several exemplary embodiments of the present disclosure. The outline is a simplified explanation regarding several concepts of one or multiple embodiments as a preface to the detailed description described later in order to provide a basic understanding of the embodiments. That is to say, the outline described below is by no means intended to restrict the scope of the present invention and the present disclosure. Furthermore, the outline described below is by no means a comprehensive outline of all possible embodiments. That is to say, the outline is by no means intended to identify the indispensable or essential elements of all the embodiments and is by no means intended to define the scope of a part of or all the embodiments. For convenience, in some cases, an "embodiment" as used in the present specification represents a single or multiple embodiments (examples and modifications) disclosed in the present specification.

In order to provide an ATE that is capable of testing an ultra-high-speed memory device, there is a need to minimize the transmission distance between a signal source (driver) and a DUT. With conventional techniques, signal transmission between a pin electronics board (PE) and a DUT has been handled by a motherboard (MB) employing a coaxial cable. However, such an arrangement has many signal degradation factors such as transmission loss in the coaxial cable, transmission loss in a connector used to couple the coaxial cable and the printed circuit board, signal reflection in a coupling point of a transmission medium such as wiring drawn from the pin electronics IC on the printed circuit board up to a connector, signal reflection due to mode conversion at the connection portion, etc. Such an arrangement is disadvantageous in accurately transmitting a high-speed signal. The present disclosure has been made based on such knowledge. The present disclosure proposes a method for reducing loss in a transmission path so as to enable a high-speed signal to be transmitted.

An interface device according to one embodiment is provided between a test head and a device under test (DUT). The interface device includes: a socket structured to mount the DUT; and a socket printed circuit board having a first face that mounts the socket and a second face provided with multiple back face electrodes; a first interposer having a first face provided with multiple deformable electrodes and a second face provided with multiple non-deformable electrodes, and structured such that the multiple deformable electrodes are in contact with the multiple back face electrodes of the socket printed circuit board; and wiring having multiple electrode pads to be coupled to the multiple non-deformable electrodes on the second face of the first interposer.

In conventional architectures, in a case in which a detachable cable is to be provided, such an arrangement employs a Low Insertion Force (LIF) connector or a Zero Insertion Force (ZIF) connector. However, such connectors each have non-negligible loss in the high frequency range. In the present embodiment, an interposer having improved high-frequency characteristics is employed instead of such a LIF connector or ZIF connector to provide electrical contact. This allows the loss in the connector to be reduced. Such an arrangement is capable of solving a problem of waveform distortion, thereby enabling testing of a high-speed device.

In one embodiment, the wiring may be an FPC cable. In a case in which a coaxial cable is employed as the wiring, there is a need to provide a circuit board as an additional component between the coaxial cable and the interposer. This has the potential to cause increased loss. In contrast, with such an arrangement in which an FPC cable is employed as the wiring, this allows a direct contact to be provided between the FPC cable and the interposer, thereby reducing such loss.

In one embodiment, the interface device may include a frontend module including multiple pin electronics Integrated Circuits (ICs) in the form of a module. Also, the frontend module and the socket printed circuit board may be coupled via the wiring. With such an arrangement in which the frontend module provided with the pin electronics ICs is built into the interface device, this allows each pin electronics IC to be arranged in the vicinity of the corresponding DUT. This allows the transmission distance of the test signal and the device signal to be dramatically shortened as compared with conventional arrangements. This is capable of suppressing the loss of high-frequency components, thereby allowing the test signal and the device signal to be transmitted at high speed. This enables accurate testing.

In one embodiment, the frontend module may further include a pin electronics printed circuit board having a face structured to mount pin electronics ICs. Also, the interface device may further include a second interposer having a first face provided with multiple deformable electrodes and a second face provided with multiple non-deformable electrodes, and structured such that the multiple deformable electrodes are in contact with the multiple back face electrodes of the pin electronics printed circuit board, and such that the multiple non-deformable electrodes are coupled to multiple electrode pads provided to the wiring. With such an arrangement in which the interposer is employed as a coupling portion that couples the pin electronics circuit and the wiring, this allows the loss to be further reduced.

In one embodiment, the interface device may be a wafer motherboard provided with a probe card instead of the socket board. Also, the first interposer may couple the probe card and the wiring.

Automatic test equipment according to one embodiment may include: a tester main body; a test head; and an interface device coupled to the test head.

EMBODIMENTS

Description will be made below regarding the preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present disclosure or the present invention. Also, it is not necessarily essential for the present disclosure and the present invention that all the features or a combination thereof be provided as described in the embodiments.

In some cases, the sizes (thickness, length, width, and the like) of each component shown in the drawings are expanded or reduced as appropriate for ease of understanding. The size relation between multiple components in the drawings does not necessarily match the actual size relation between them. That is to say, even in a case in which a given member A has a thickness that is larger than that of another member B in the drawings, in some cases, in actuality, the member A has a thickness that is smaller than that of the member B.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Figure 2:
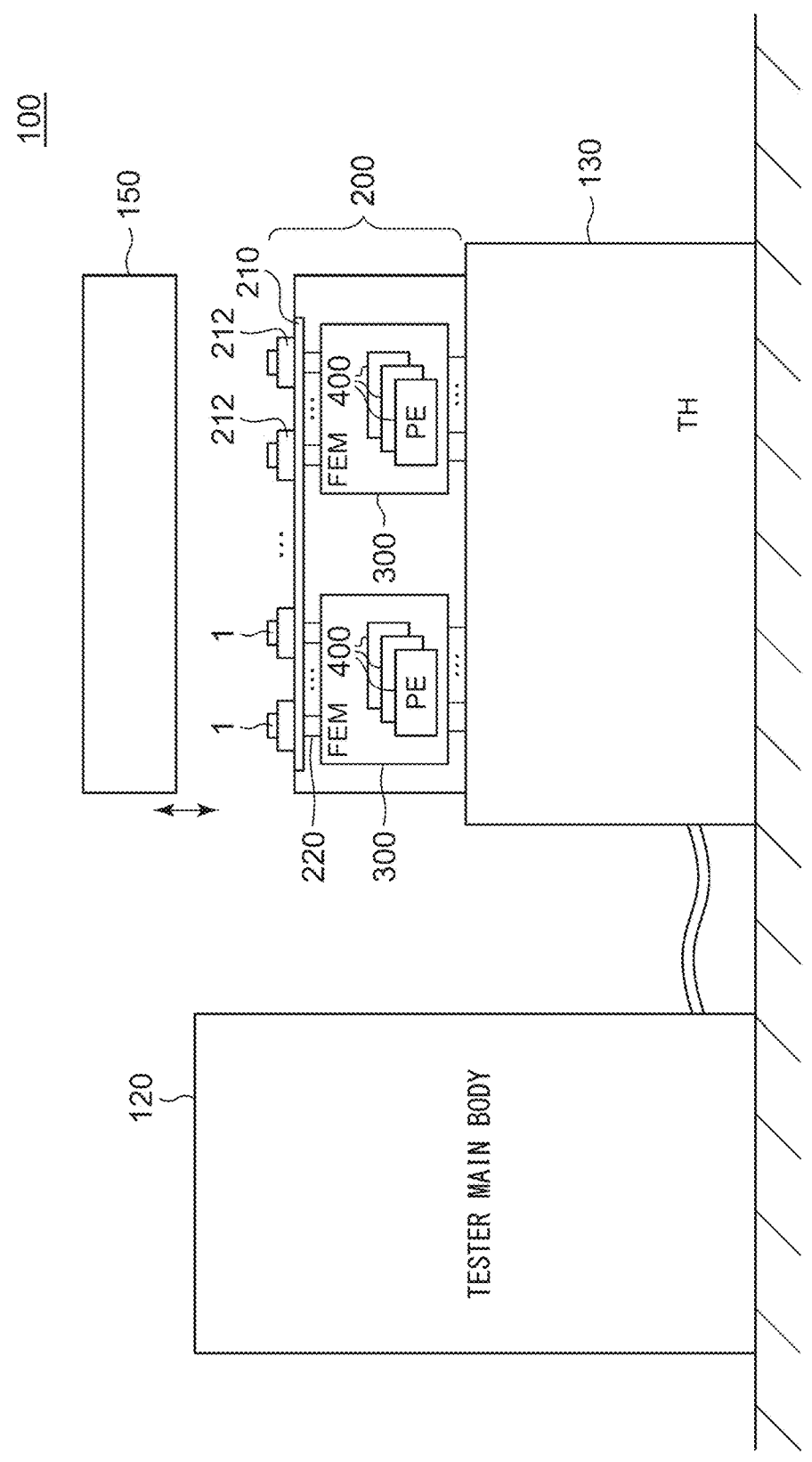
FIG. 2 is a diagram showing an ATE according to an embodiment.

FIG. 2 is a diagram showing an ATE 100 according to an embodiment. The ATE 100 includes a tester 120, a test head 130, a handler 150, and an interface device 200.

The tester 120 integrally controls the ATE 100. Specifically, the tester 120 executes a test program so as to control the test head 130 and the handler 150, and so as to collect measurement results.

The handler 150 supplies (loads) each DUT 1 to the interface device 200. Furthermore, the handler 150 unloads each DUT 1 from the interface device 200 after it is tested. Moreover, the handler 150 classifies the DUTs 1 into non-defective DUTs and defective DUTs.

The interface device 200 includes a socket board 210, wiring 220, and a frontend module 300.

In the present embodiment, the multiple pin electronics ICs (PE-ICs) 400 are provided in the interface device 200 instead of being provided in the test head 130. Each pin electronics IC 400 is configured as a dedicated integrated circuit (ASIC: Application Specific IC) on which drivers configured to generate a test signal and comparators configured to receive a device signal are integrated. The test signal and the device signal are each configured as an NRZ signal or PAM4 signal.

More specifically, the multiple pin electronics ICs 400 are configured as a module. This module will be referred to as a "frontend module 300".

The socket board 210 is provided with multiple sockets 212. A DUT 1 is mounted on each socket 212. The frontend module 300 is coupled to each socket 212 via the wiring 220.

The above is the configuration of the ATE 100.

With the ATE 100 in which the frontend module 300 configured as a module of the multiple pin electronics ICs 400 is included as an internal component of the interface device 200, this allows the pin electronics ICs 400 to be arranged in the vicinity of the DUTs 1. This allows the transmission distance of the test signals and the device signals to be dramatically reduced.

In a conventional ATE, each pin electronics IC and the socket board are coupled via a coaxial cable having a length on the order of 500 mm to 600 mm, for example. However, with the present embodiment, the length of the wiring 220 can be reduced to approximately 100 mm to 150 mm. This allows the loss of high-frequency components to be dramatically reduced, thereby enabling high-speed test signals and device signals to be transmitted. The ATE 100 provided with such an interface device 200 is capable of providing testing of 20 Gbps or faster high-speed memory.

The present disclosure encompasses various kinds of apparatuses and methods that can be regarded as a block configuration or a circuit configuration shown in FIG. 2, or otherwise that can be derived from the aforementioned description. That is to say, the present disclosure is not restricted to a specific configuration. More specific description will be made below regarding example configurations or examples for clarification and ease of understanding of the essence of the present disclosure and the present invention and the operation thereof. That is to say, the following description will by no means be intended to restrict the technical scope of the present disclosure.

Figure 3:
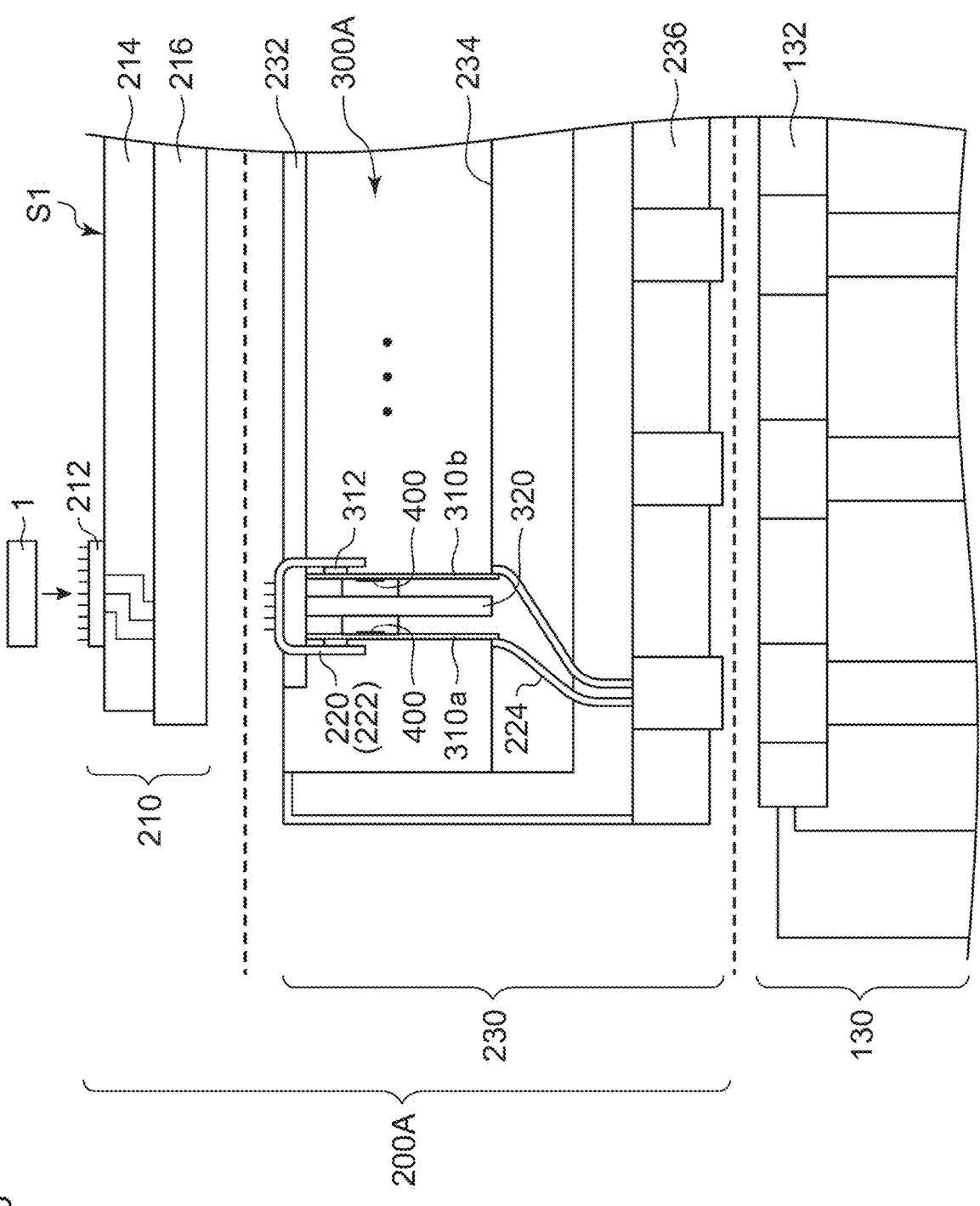
FIG. 3 is a cross-sectional diagram of an interface device according to one embodiment.

FIG. 3 is a cross-sectional view of an interface device 200A according to an embodiment. FIG. 3 shows only a configuration relating to a single DUT. In this example, the interface device 200A includes a motherboard 230 and a socket board 210 detachably mounted on the motherboard 230. The socket board 210 includes a socket 212, a socket printed-circuit board (socket PCB) 214, and a socket-board-side connector 216.

The frontend module 300A is provided with multiple printed-circuit boards (pin electronics PCBs) 310 on which multiple pin electronics ICs 400 are mounted. The multiple pin electronics PCBs 310 are each arranged with an orientation that is orthogonal to the faces (front face and back face) of each DUT, i.e., the face S1 of the socket board 210. In the present embodiment, the socket board 210 is arranged parallel to the ground. Accordingly, the multiple pin electronics PCBs 310 are each arranged parallel to the direction of gravity.

The frontend module 300A is further provided with a plate-shaped cooling device (which will be referred to as a "cold plate" hereafter) 320. The cold plate 320 has flow channels through which refrigerant is distributed.

The multiple pin electronics PCBs 310a and 310b and the cold plate 320 are stacked such that the pin electronics ICs 400 are thermally coupled with the cold plate 320.

The motherboard 230 includes a socket-board-side connector 232, a spacing frame 234, and a relay connector 236. The frontend module 300A is fixed to the frame 234. Each relay connector 236 is electrically and mechanically coupled to the test-head-side connector 132.

As the wiring 220, a cable configured as a Flexible Printed Circuit (FPC) (which will also be referred to as an "FPC cable") can be employed instead of a coaxial cable according to a conventional technique. However, detailed description will be made later.

On the other hand, only a control signal for each pin electronics IC 400 is transmitted via the wiring 224 that couples the pin electronics PCB 310 and the relay connector 236. That is to say, neither the test signal nor the device signal is transmitted via the wiring 224. Accordingly, as the wiring 224, a coaxial cable may be employed.

The multiple pin electronics ICs 400 are each mounted on the corresponding pin electronics PCB 310 such that they are closer to the corresponding DUT (closer to the socket board 210) than to the center in the vertical direction of the pin electronics PCB 310. This allows the transmission distance of the test signal and the device signal to be reduced on the pin electronics PCB 310, thereby providing high-speed signal transmission.

For example, each of the multiple pin electronics ICs 400 is preferably arranged on the pin electronics PCB 310 such that the distance between it and one side of the pin electronics PCB 310 on the DUT side is 50 mm or less. Furthermore, with an arrangement in which each pin electronics IC 400 is arranged such that the distance is 30 mm or less, this allows the transmission distance to be further reduced.

Figure 4:
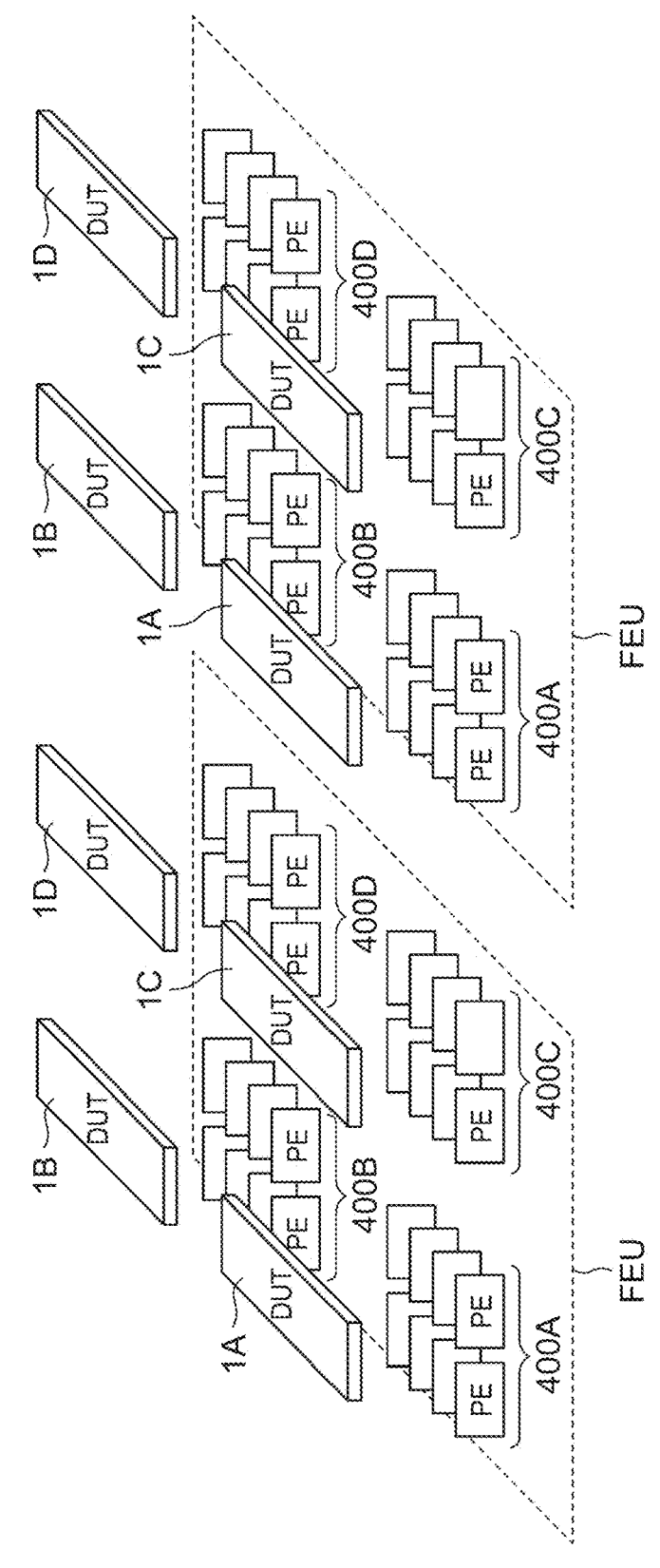
FIG. 4 is a diagram showing a frontend module according to one embodiment.

FIG. 4 is a diagram showing a frontend module 300B according to one example.

(2×M) (M≥1) pin electronics ICs 400 are assigned to each single DUT 1. The multiple DUTs and the multiple pin electronics ICs 400 are indicated by "A" through "D" appended as suffixes, to distinguish them as necessary. In this example, in a case in which each DUT 1 has 192 I/Os and each electronics IC 400 has 24 I/Os, (192/24=8) (i.e., M=4) pin electronics ICs 400 are assigned to each single DUT.

The frontend module 300B is configured with divisions each defined for every N (N≥2) multiple DUTs 1. Each division unit will be referred to as a "front-end unit (FEU)". In this example, each block that corresponds to four DUTs forms a single FEU. Each single FEU is provided with (2×M×N=2×4×4=32) pin electronics ICs 400.

FIG. 4 shows two FEUs. In actuality, the frontend module 300B may be provided with two or more FEUs. For example, with an ATE that is capable of measuring 64 DUTs at the same time, (64/4=16) FEUs are provided. Accordingly, the number of all the I/Os provided to the frontend module 300B is 64×192=12,288.

Figure 5:
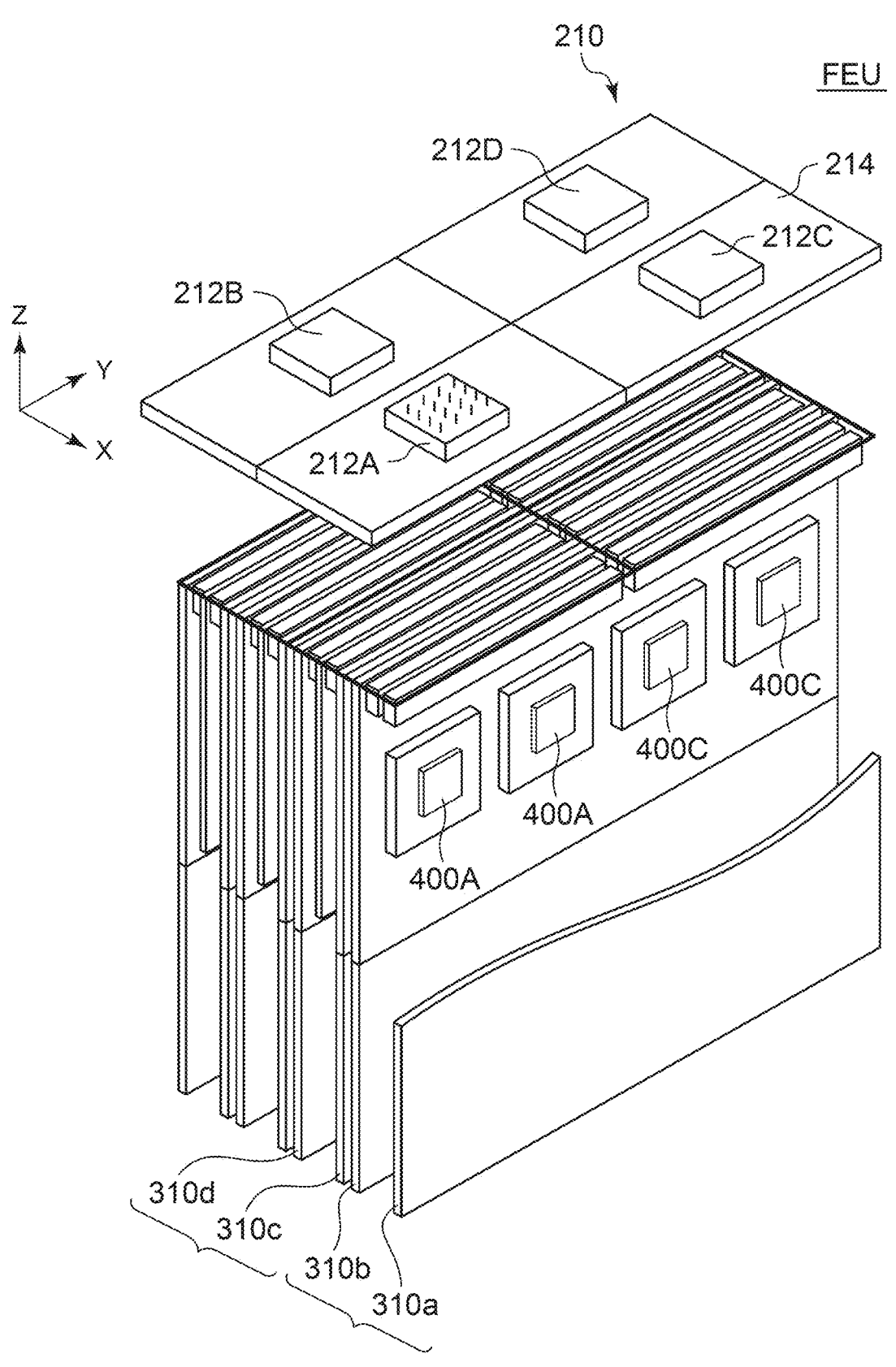
FIG. 5 is a perspective diagram showing an example configuration of the FEU shown in FIG. 4.

FIG. 5 is a perspective diagram showing an example configuration of the FEU shown in FIG. 4. The sockets 212A through 212D that correspond to the four DUTs are arranged in the form of a matrix having two rows and two columns. Directing attention to a single DUT 1A, the eight pin electronics ICs 400A assigned to the DUT 1A are mounted on the four pin electronics PCBs 310a through 310d arranged in the X direction such that two pin electronics ICs 400A are provided to each pin electronics PCB. The socket PCB 214 on which the sockets 212 are to be mounted may be configured as divided socket PCBs for each corresponding DUT. Also, the socket PCBs 214 that correspond to the four DUTs may be monolithically configured as a single circuit board.

The two pin electronics ICs 400A mounted on the single pin electronics PCB 310 are arranged in the Y direction. The two pin electronics ICs 400A are arranged at the same distance from the DUT 1A.

Figure 6:
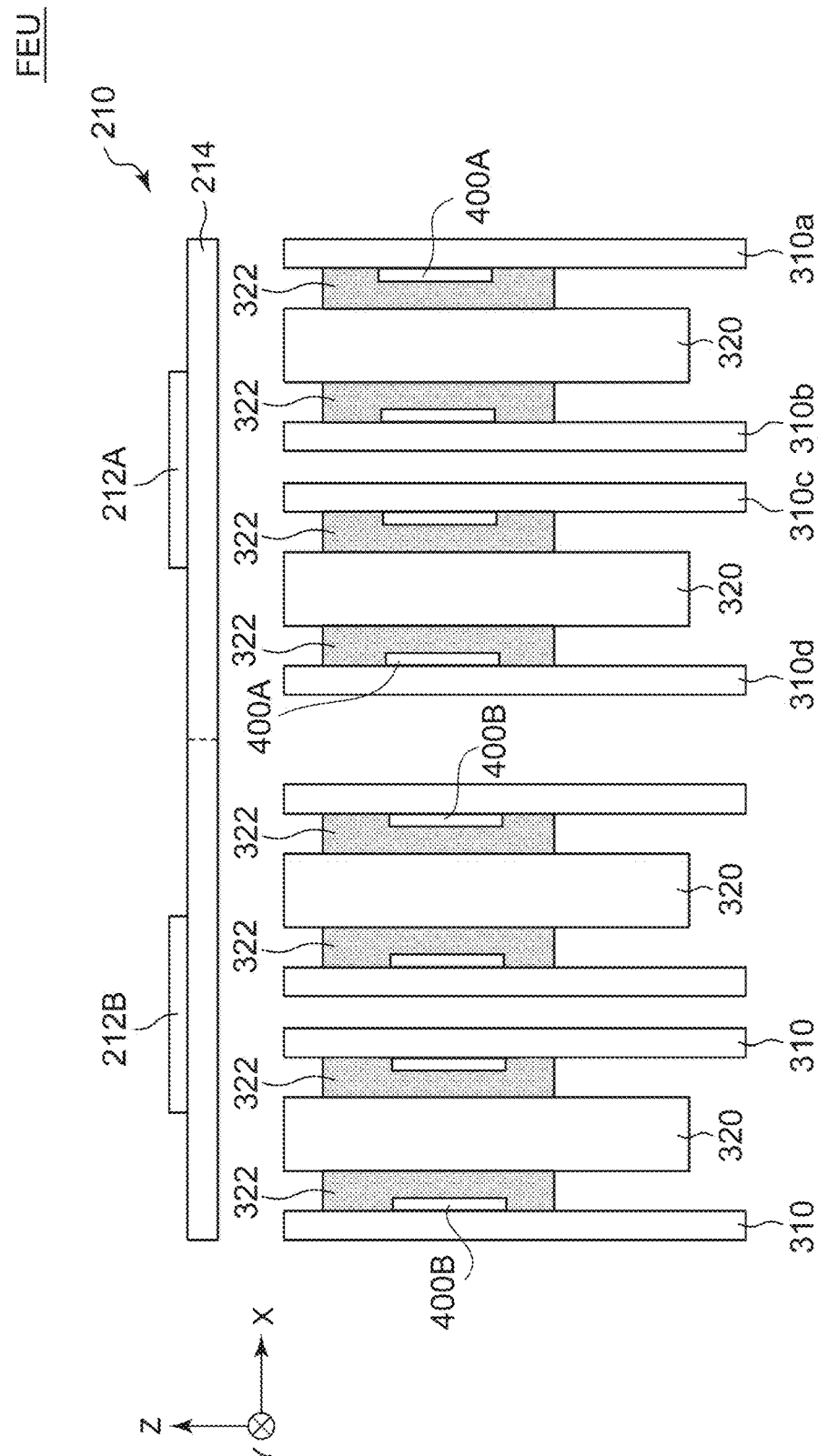
FIG. 6 is a cross-sectional diagram showing an example configuration of the FEU shown in FIG. 4.

FIG. 6 is a cross-sectional diagram showing an example configuration of the FEU shown in FIG. 4. As shown in FIG. 3, a cold plate 320 is provided between two pin electronics PCBs 310a and 310b. In the same manner, a cold plate 320 is provided between two pin electronics PCBs 310c and 310d. As described above, each pin electronics IC 400 is mounted on a pin electronics PCB 310 such that it is closer to the socket board 210. In order to provide improved cooling efficiency, each pin electronics IC 400 may be configured as a bare chip. Each pin electronics IC 400 and the corresponding cold plate 320 are thermally coupled via a thermal interface material (TIM) 322.

As viewed in a plan view of the FEU along the Y axis, the center of the DUT, i.e., the socket 212A, is positioned at the center position of the four (M) pin electronics PCBs 310a through 310d arranged in the X direction.

The above is the configuration of the FEU.

Description will be made regarding the advantage of the FEU. Attention will be directed to the DUT 1A, with "A" as a suffix. The multiple (eight, in this example) pin electronics ICs 400A that correspond to the single DUT 1A are mounted on the four pin electronics PCBs 310a through 310d such that two pin electronics ICs 400A are provided to each pin electronics PCB. This allows the distance between each of the eight pin electronics ICs 400A and the socket 212A to be uniform. This allows the loss that occurs in the transmission path from each pin electronics IC 400A up to the socket 212A (DUT 1A) to be uniform, thereby providing accurate testing.

Next, description will be made regarding the electrical coupling between each pin electronics IC 400 and the socket 212.

Figure 7:
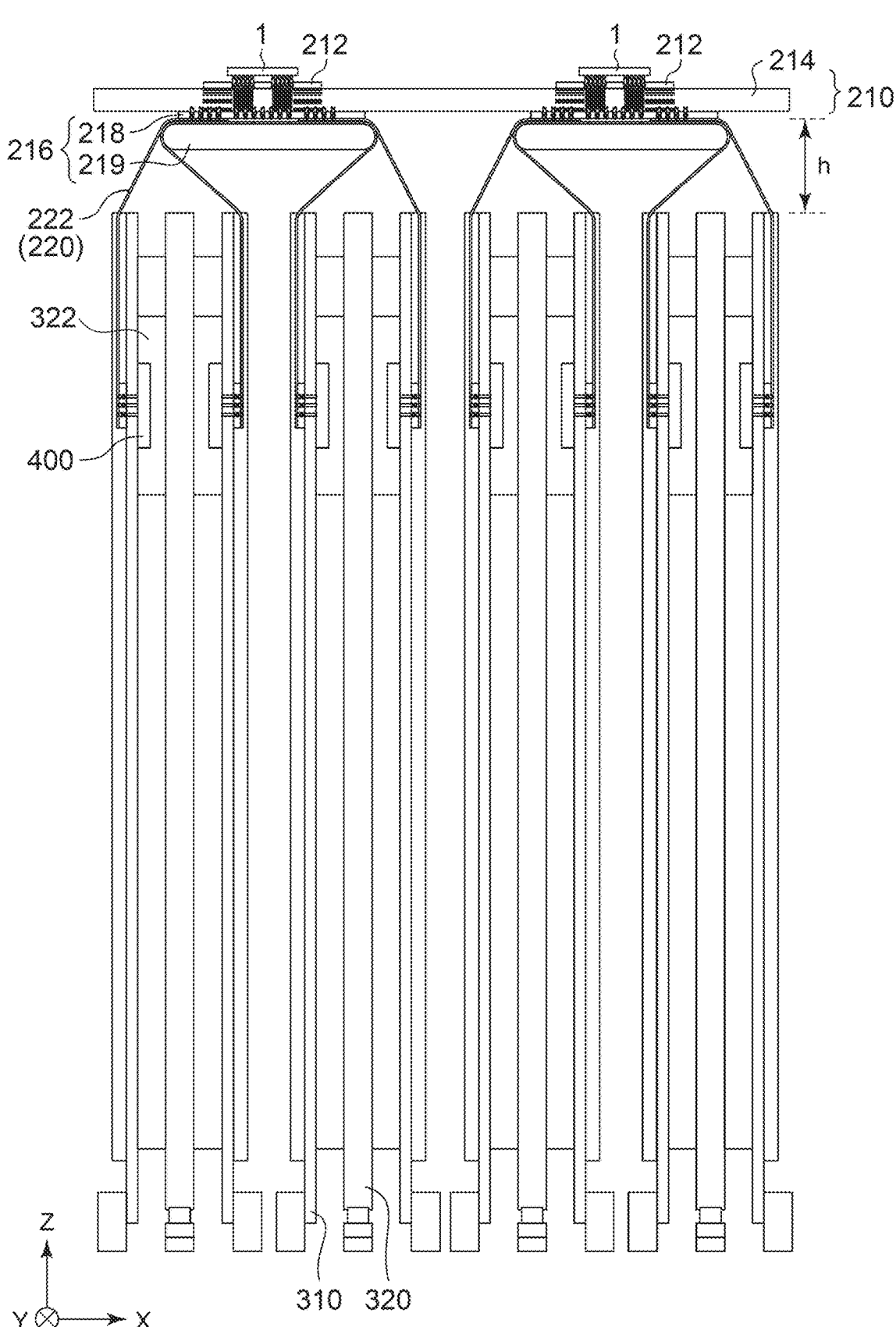
FIG. 7 is a cross-sectional diagram showing an example of a coupling between a pin electronics IC and a socket.

FIG. 7 is a cross-sectional diagram showing an example of the coupling between the pin electronics IC and the socket (DUT 1). As the transmission path via which the test signal and the device signal are to be transmitted, i.e., as the wiring 220 between the pin electronics PCB 310 and the socket board 210, an FPC cable 222 is employed.

In a case in which a coaxial cable is employed as the wiring 220 between the pin electronics PCB 310 and the socket board 210, this leads to a limitation on the minimum distance between the pin electronics PCB 310 and the socket board 210 due to the rigidity of the coaxial cable. In contrast, with an arrangement employing the FPC cable 222, this allows the distance h between the pin electronics PCB 310 and the socket board 210 to be shortened due to its flexibility as compared with an arrangement employing a coaxial cable. This allows the transmission distance of the test signal and the device signal to be shortened.

In typical conventional test equipment configured to detachably mount the socket board 210, a Low Insertion Force (LIF) connector is employed. Such a LIF connector has non-negligible loss on the order of −3 dB in a frequency band that is higher than 14 GHz. This leads to waveform distortion in 28 Gbps or 40 Gbps high-speed transmission. With such an arrangement employing the FPC cable 222 as the wiring 220, such an arrangement requires no LIF connector. This is capable of suppressing waveform distortion due to the loss (attenuation in the high-frequency band), thereby providing accurate testing.

Figure 8:
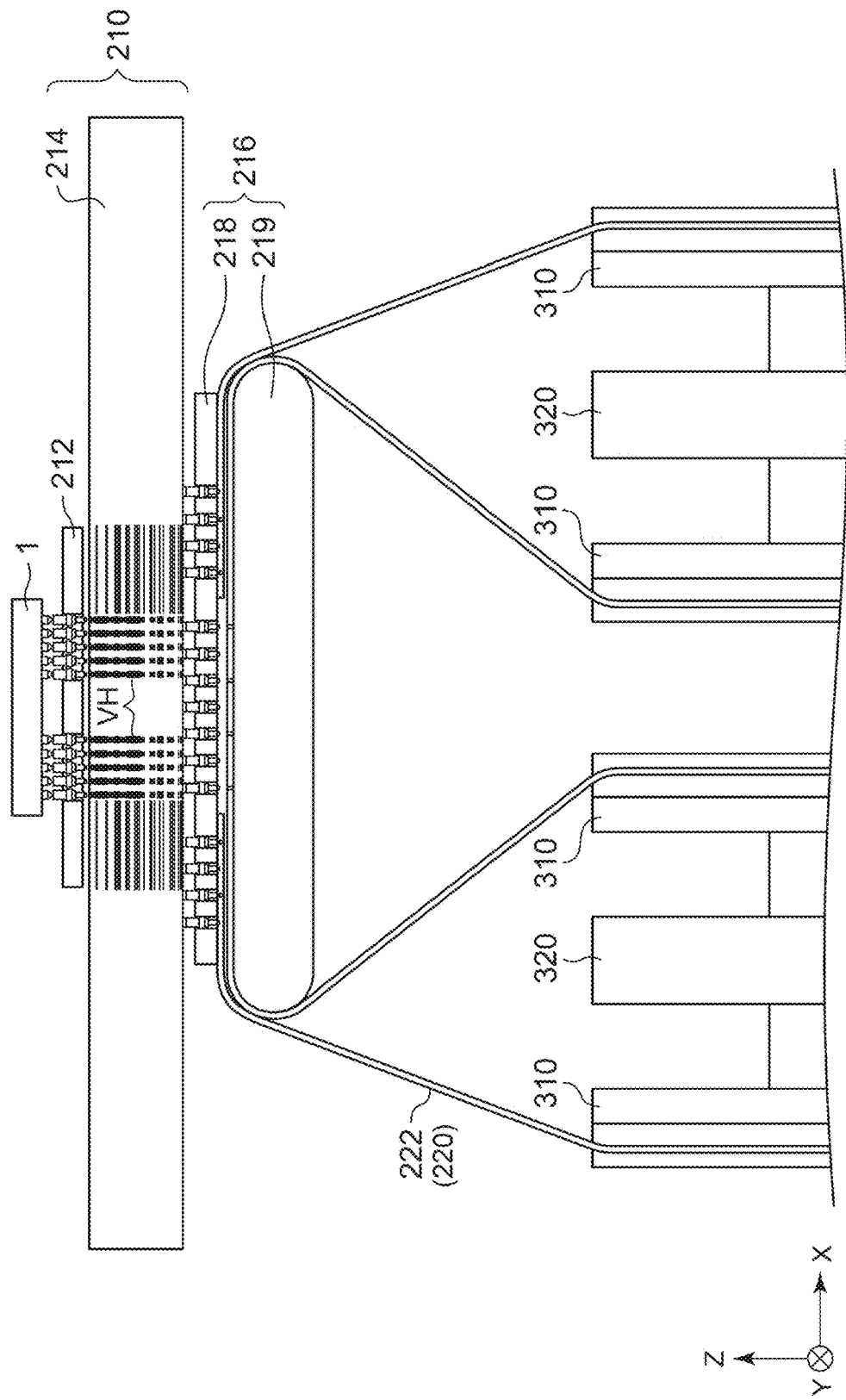
FIG. 8 is a cross-sectional diagram showing an example configuration of a coupling portion between an FPC cable and a socket board.
Figure 9:
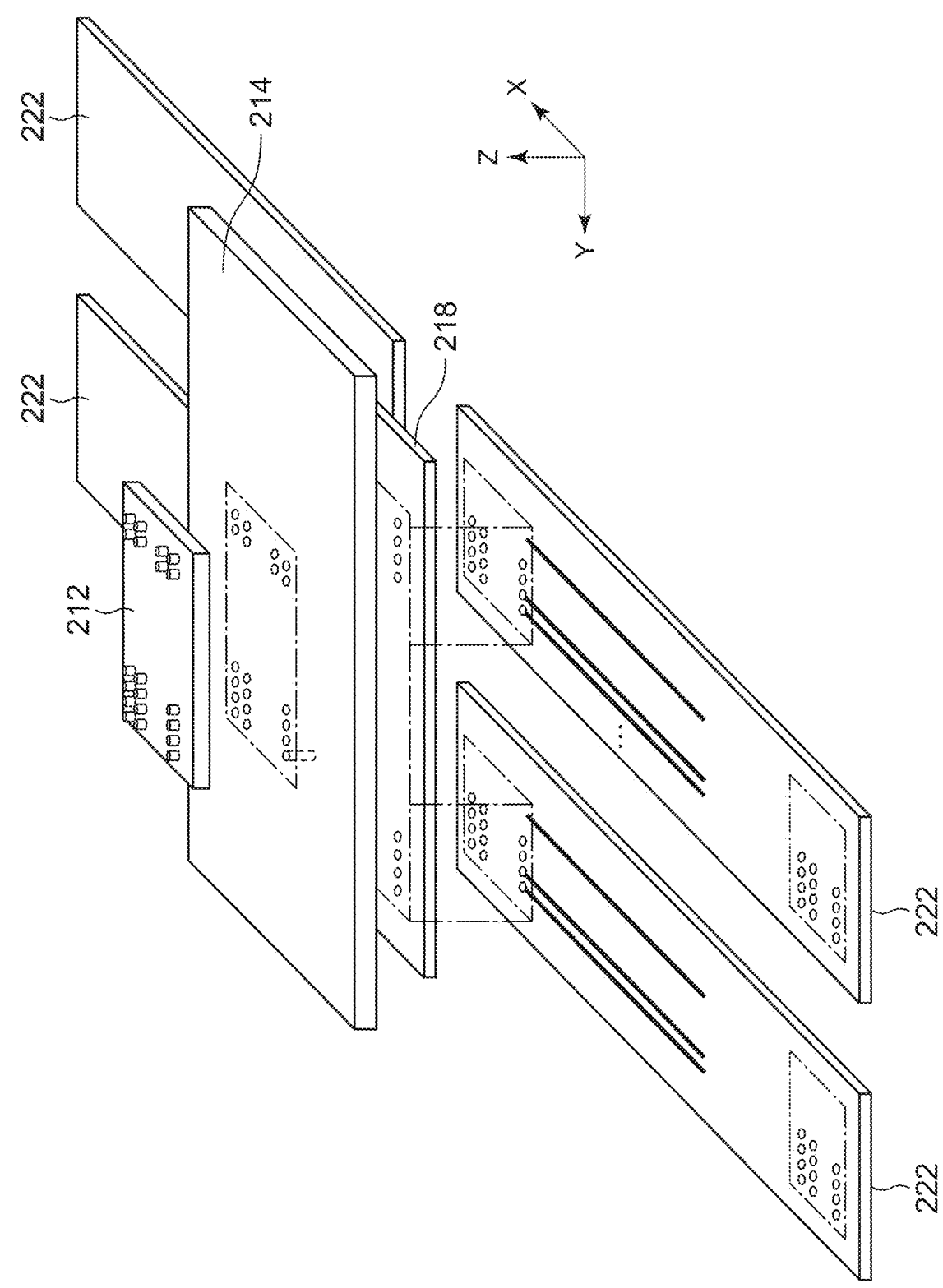
FIG. 9 is an exploded perspective view showing a coupling portion between the FPC cable and the socket board.

FIG. 8 is a cross-sectional diagram showing an example configuration of a coupling portion between the FPC cable 222 and the socket board 210. FIG. 9 is an exploded perspective view showing a coupling portion between the FPC cable 222 and the socket board 210.

The socket board 210 includes the socket 212 and the socket PCB 214. The socket PCB 214 is configured as a multi-layer substrate including a wiring layer and an insulating layer. In the wiring layer, wiring is formed so as to extend the signal paths in the horizontal direction. In the insulating layer, via holes VH are formed so as to extend the signal paths in the vertical direction. The paths via which the test signal and the device signal are to be transmitted are preferably drawn to the back face of the socket board 210 such that the extension in the horizontal direction (X direction and Y direction) has as short a distance as possible. In contrast, with a path of a power supply signal or a control signal having a low frequency, there is no problem in drawing such a path in the horizontal direction as an internal component of the socket PCB 214.

The FPC cable 222 and the socket board 210 are coupled via the socket-board-side connector 216. The socket-board-side connector 216 includes an interposer 218 and a cable clamp 219.

The electrodes exposed on the surface of the interposer 218 are electrically coupled to the electrodes exposed on the back face of the socket PCB 214. The FPC cable 222 is arranged such that it is clamped by the cable clamp 219 in a state in which it is in contact with the back face electrodes of the interposer 218.

Figures 10A, 10B:
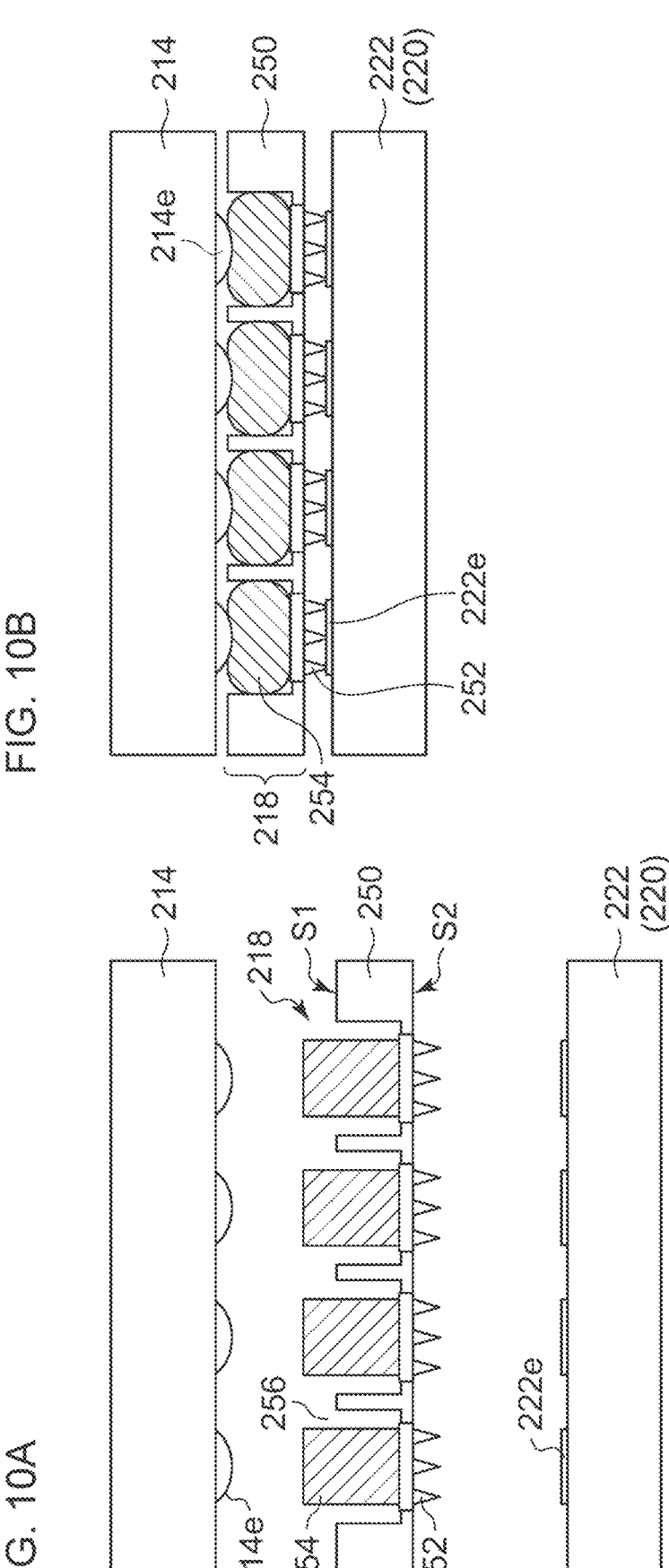
FIGS. 10A and 10B are cross-sectional diagrams for explaining the configuration and coupling of an interposer.

FIGS. 10A and 10B are cross-sectional diagrams for explaining the configuration and coupling of the interposer. FIG. 10A shows a state before coupling. FIG. 10B shows a state after coupling. The interposer 218 includes a substrate 250, a non-deformable electrode 252, and a deformable electrode 254. The substrate 250 has a first face S1 provided with openings 256. A deformable electrode 254 is embedded within each opening 256. Each deformable electrode 254 has conductivity and elasticity. Before the coupling, each deformable electrode 254 protrudes from the first face of the substrate 250. Each deformable electrode 254 may be configured as a conductive gasket or conductive elastomer. Also, each deformable electrode 254 may be configured as an electrode with a spring such as a pogo pin or the like.

The substrate 250 has a second face S2 provided with non-deformable electrodes 252. Each non-deformable electrode 252 is electrically coupled to the corresponding deformable electrode 254 within the substrate 250. Each non-deformable electrode 252 has multiple protrusions that provide multi-point coupling.

As shown in FIG. 10B, when pressure is applied to the socket PCB 214 and the FPC cable 222 in a state in which the interposer 218 is interposed between them, each non-deformable electrode 252 of the interposer 218 comes in contact with the corresponding electrode 222e of the FPC cable 222. Furthermore, this deforms each deformable electrode 254, thereby pressing each deformable electrode 254 in contact with the corresponding back face electrode 214e of the socket PCB 214.

Such an interposer 218 can be configured to have a small parasitic capacitance as compared with a LIF connector or ZIF connector, thereby providing improved high-frequency characteristics. This provides flat transmission characteristics (S21 characteristics of the S parameter) over a range of 0 to 40 GHz.

Figure 11:
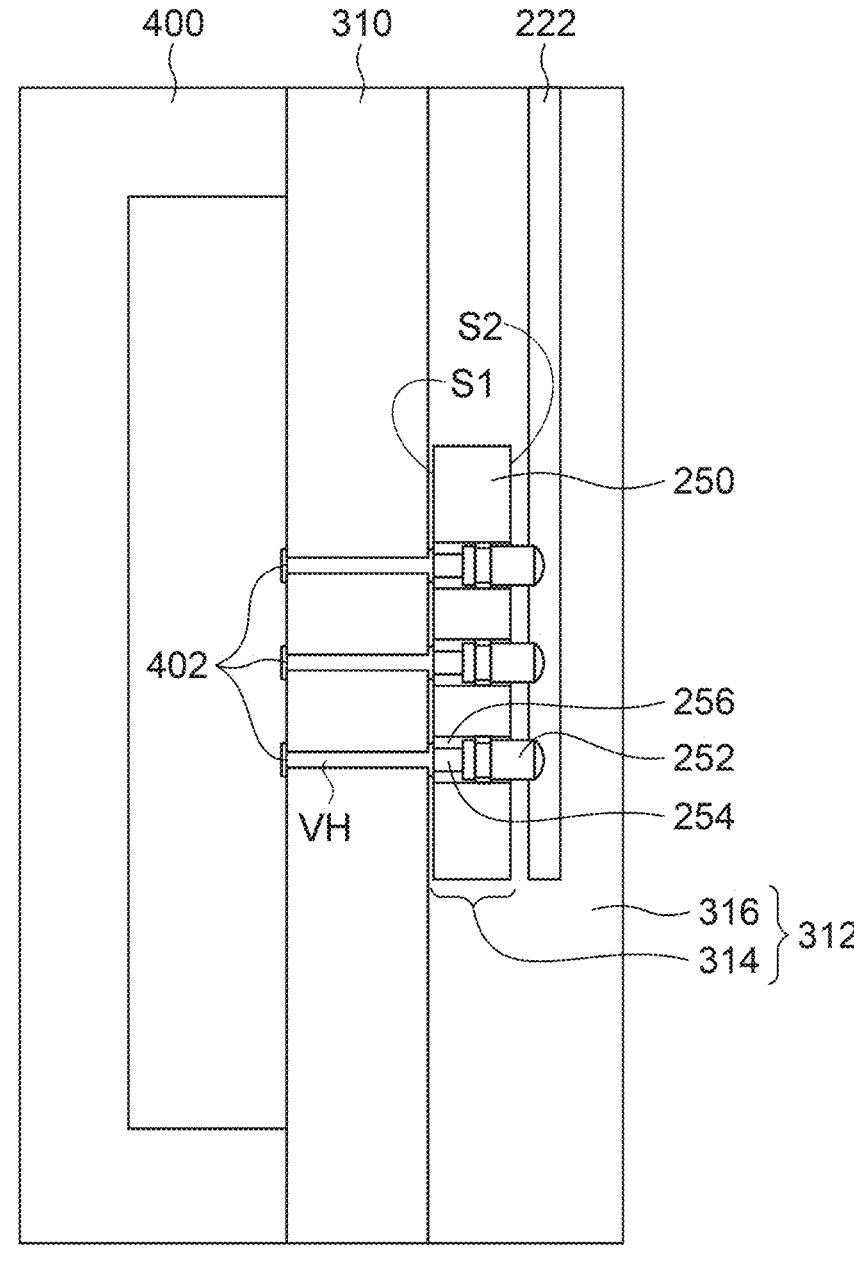
FIG. 11 is a cross-sectional diagram showing an example configuration of a coupling portion between the FPC cable and a pin electronics PCB.
Figure 12:
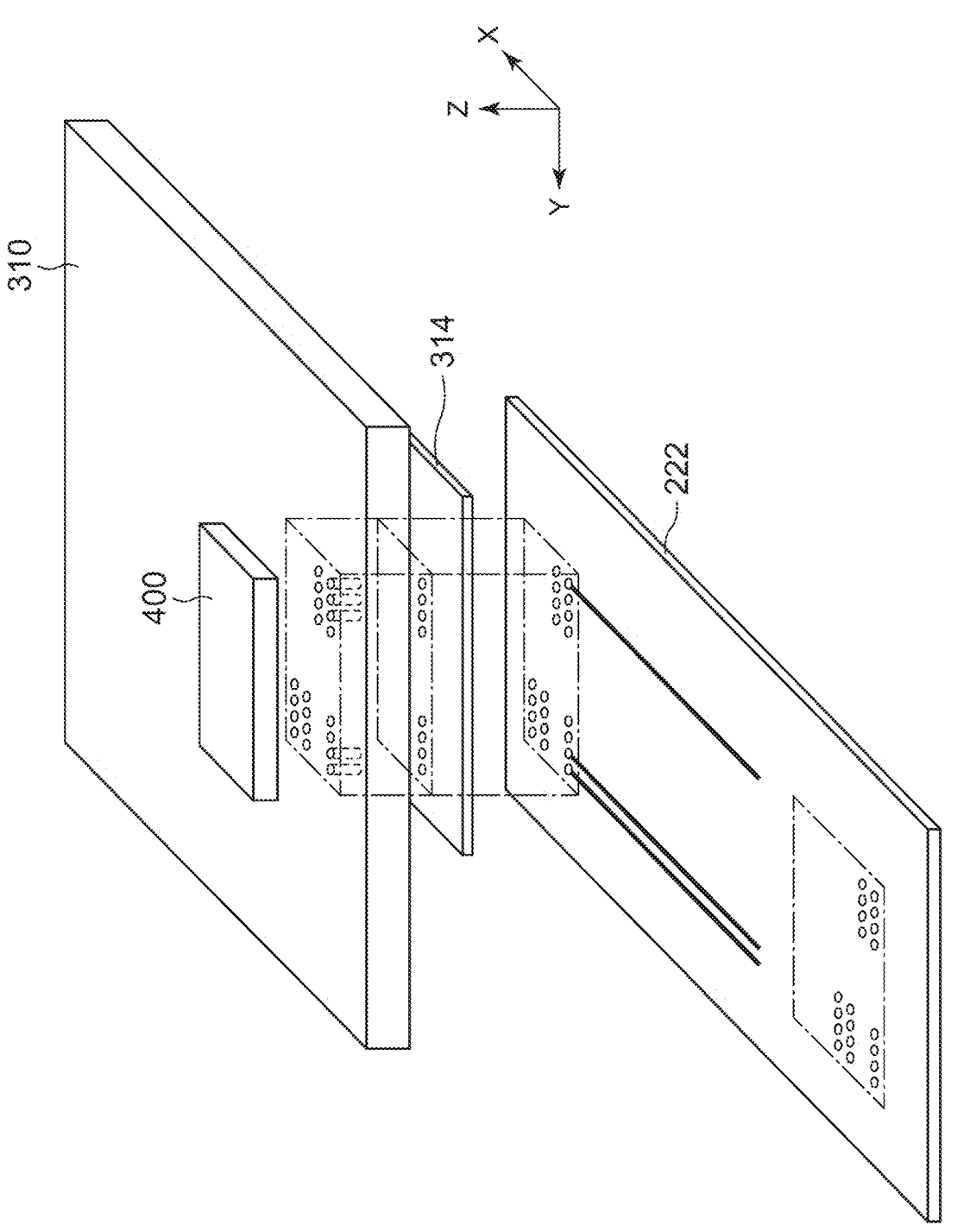
FIG. 12 is an exploded perspective view showing a coupling portion between the FPC cable and the pin electronics PCB.

FIG. 11 is a cross-sectional diagram showing an example configuration of a coupling portion between the FPC cable 222 and the pin electronics PCB 310. FIG. 12 is an exploded perspective view showing a coupling portion between the FPC cable 222 and the pin electronics PCB 310.

Referring to FIG. 11, description will be made. The FPC cable 222 and the pin electronics PCB 310 are coupled via an FPC connector 312. The FPC connector 312 is configured in the same manner as the socket-board-side connector 216. Specifically, the FPC connector 312 includes an interposer 314 and a cable clamp 316.

Each deformable electrode 254 exposed on the first face S1 of the interposer 314 is electrically coupled to the corresponding electrode on the back face of the pin electronics PCB 310. The FPC cable 222 is arranged such that it is clamped by the cable clamp 316 in a state in which it is electrically in contact with each non-deformable electrode 252 exposed on the second face S2 of the interposer 314.

Via holes VH are formed in the pin electronics PCB 310. Even within the pin electronics PCB 310, the lengths of the transmission paths of the test signal and the device signal are preferably minimized. Accordingly, each via hole VH formed in the pin electronics PCB 310 may preferably be arranged at a position that overlaps the corresponding back-face electrode 402 of the pin electronics IC 400. With this, each transmission path is not drawn in the in-plane direction of the printed circuit board within the pin electronics PCB 310, thereby providing high-speed signal transmission.

The interface device 200 may employ various kinds of configurations. The present disclosure is applicable to all these configurations.

Socket Board Change (SBC) Type

The SBC type is a type of interface device configured such that the socket board 210 is replaced according to the kind of the DUT.

Cable Less (CLS) Type

The CLS type is a type of interface device in which the interface device 200 is configured such that it can be separated into the upper Defective Specific Adapter (DSA) and the lower motherboard. This allows the DSA to be replaced according to the kind of the DUT. As an application of the interface device 200 according to the present embodiment to the CLS type, two configurations are conceivable.

One is an arrangement in which the frontend module 300 is arranged on the motherboard side. In this case, the frontend module 300 can be shared between testing of different DUTs, thereby providing an advantage from the cost viewpoint.

The other is an arrangement in which the frontend module 300 is arranged on the DSA side. In this case, a frontend module 300 is provided for each DSA. This involves an increased cost of the device. However, this allows each frontend module 300 to be arranged closer to the corresponding DUT, thereby providing an advantage from the viewpoint of providing high-speed testing.

Cable Connection (CCN) Type

The CCN type is a type of interface device configured such that the whole of the interface device 200 is replaced according to the kind of the DUT. With such an arrangement in which the interface device 200 according to the present embodiment is applied to the CCN type, this allows the frontend module 300 to be placed as close as possible to the DUT, thereby providing an advantage from the viewpoint of providing high-speed testing.

Wafer Motherboard

The interface device 200 may be configured as a wafer motherboard to be used for wafer-level testing. In this case, the interface device 200 may be provided with a probe card instead of the socket board.

The above-described embodiments have been described for exemplary purposes only. Rather, it can be readily conceived by those skilled in this art that various modifications may be made by making various combinations of the aforementioned components or processes. Description will be made below regarding such modifications.

MODIFICATION 1

Description has been made regarding an arrangement employing the interposer as a coupling interface between the FPC cable 222 and the pin electronics PCB 310, or a coupling interface between the FPC cable 222 and the socket board 210. However, the present disclosure is not restricted to such an arrangement.

MODIFICATION 2

Description has been made in the embodiment regarding the interface device 200 having the socket board 210 arranged parallel to the ground. However, the present disclosure is not restricted to such an arrangement. For example, the socket board 210 may be arranged with an orientation that is orthogonal to the ground. In this case, the Y direction shown in FIGS. 5, 6, and so forth, becomes the direction of gravity.

Description has been made regarding the present embodiments according to the present disclosure using specific terms. However, the above-described embodiments show only an example for ease of understanding. That is to say, the embodiments described above are by no means intended to restrict the technical scope of the present disclosure or claims. The technical scope of the present invention is defined in appended claims. Accordingly, embodiments, examples, and modifications that have not been described above are encompassed in the technical scope of the present invention.

What is claimed is:

1. An interface device provided between a test head and a device under test (DUT), comprising:
   a socket board comprising: a socket structured to mount the DUT; and a socket printed circuit board having a first face that mounts the socket and a second face provided with a plurality of back face electrodes;
   a first interposer having a first face provided with a plurality of deformable electrodes and a second face provided with a plurality of non-deformable electrodes, and structured such that the plurality of deformable electrodes are in contact with the plurality of back face electrodes of the socket printed circuit board; and
   wiring having a plurality of electrode pads to be coupled to the plurality of non-deformable electrodes on the second face of the first interposer.

2. The interface device according to claim 1, wherein the wiring is an FPC cable.

3. The interface device according to claim 1, comprising a frontend module comprising a plurality of pin electronics Integrated Circuits (ICs) in the form of a module,
   wherein the frontend module and the socket printed circuit board are coupled via the wiring.

4. The interface device according to claim 3, wherein the frontend module further comprises a pin electronics printed circuit board having a face structured to mount pin electronics ICs,
   wherein the interface device further comprises a second interposer having a first face provided with a plurality of deformable electrodes and a second face provided with a plurality of non-deformable electrodes, and structured such that the plurality of deformable electrodes are in contact with the plurality of back face electrodes of the pin electronics printed circuit board, and such that the plurality of non-deformable electrodes are coupled to a plurality of electrode pads provided to the wiring.

5. Automatic test equipment comprising:
   a tester main body;
   a test head; and
   the interface device according to claim 1, coupled to the test head.

6. An interface device used as a wafer motherboard provided between a test head and a wafer under test, comprising:
   a board comprising: a probe card; and a printed circuit board having a first face that mounts the probe card and a second face provided with a plurality of back face electrodes;
   a first interposer having a first face provided with a plurality of deformable electrodes and a second face provided with a plurality of non-deformable electrodes, and structured such that the plurality of deformable electrodes are in contact with the plurality of back face electrodes of the printed circuit board; and
   wiring having a plurality of electrode pads to be coupled to the plurality of non-deformable electrodes on the second face of the first interposer.

7. The interface device according to claim 6, wherein the wiring is an FPC cable.

8. The interface device according to claim 6, comprising a frontend module comprising a plurality of pin electronics Integrated Circuits (ICs) in the form of a module,
   wherein the frontend module and the printed circuit board are coupled via the wiring.

9. The interface device according to claim 8, wherein the frontend module further comprises a pin electronics printed circuit board having a face structured to mount pin electronics ICs,
   wherein the interface device further comprises a second interposer having a first face provided with a plurality of deformable electrodes and a second face provided with a plurality of non-deformable electrodes, and structured such that the plurality of deformable electrodes are in contact with the plurality of back face electrodes of the pin electronics printed circuit board, and such that the plurality of non-deformable electrodes are coupled to a plurality of electrode pads provided to the wiring.

10. Automatic test equipment comprising:
    a tester main body;
    a test head; and
    the interface device according to claim 6, coupled to the test head.

* * * * *